(12) United States Patent
Danoski et al.

(10) Patent No.: US 7,294,791 B2
(45) Date of Patent: Nov. 13, 2007

(54) CIRCUITIZED SUBSTRATE WITH IMPROVED IMPEDANCE CONTROL CIRCUITRY, METHOD OF MAKING SAME, ELECTRICAL ASSEMBLY AND INFORMATION HANDLING SYSTEM UTILIZING SAME

(75) Inventors: Charles E. Danoski, Endicott, NY (US); Irving Memis, Vestal, NY (US); Steven G. Rosser, Apalachin, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 274 days.

(21) Appl. No.: 10/953,923

(22) Filed: Sep. 29, 2004

(65) Prior Publication Data
US 2006/0065433 A1 Mar. 30, 2006

(51) Int. Cl.
H01R 12/04 (2006.01)
H05K 1/11 (2006.01)

(52) U.S. Cl. ............... 174/261; 174/262; 361/794; 333/32

(58) Field of Classification Search .......... 174/261, 174/262–266; 361/761, 794, 795, 792–793; 333/32–35
See application file for complete search history.

(56) References Cited

U.S. PATENT DOCUMENTS

| | | | |
|---|---|---|---|
| 5,677,241 A | 10/1997 | Manning | |
| 5,880,018 A | 3/1999 | Boeck et al. | |
| 6,034,332 A * | 3/2000 | Moresco et al. | 174/255 |
| 6,119,335 A | 9/2000 | Park et al. | |
| 6,405,431 B1 | 6/2002 | Shin et al. | |
| 6,444,919 B1 * | 9/2002 | Economikos et al. | 174/255 |
| 6,465,730 B1 * | 10/2002 | Pluymers et al. | 174/28 |
| 6,521,845 B1 * | 2/2003 | Barrow | 174/260 |
| 6,566,601 B2 * | 5/2003 | Maetani | 174/535 |
| 6,577,490 B2 * | 6/2003 | Ogawa et al. | 361/306.1 |
| 6,594,153 B1 * | 7/2003 | Zu et al. | 361/792 |
| 6,608,259 B1 * | 8/2003 | Norskov | 174/261 |
| 6,613,413 B1 * | 9/2003 | Japp et al. | 428/131 |
| 6,677,831 B1 | 1/2004 | Cheng et al. | |
| 6,707,685 B2 | 3/2004 | Kabumoto et al. | |
| 6,726,488 B2 | 4/2004 | Shirasaki | |
| 6,747,356 B2 * | 6/2004 | Ando et al. | 257/758 |
| 6,775,122 B1 | 8/2004 | Dishongh et al. | |
| 2004/0118602 A1* | 6/2004 | Lee et al. | 174/260 |

* cited by examiner

*Primary Examiner*—Jeremy C Norris
(74) *Attorney, Agent, or Firm*—Hinman, Howard & Kattell, LLP; Lawrence R. Fraley

(57) ABSTRACT

A circuitized substrate designed to substantially eliminate impedance disruptions during passage of signals through signal lines of the substrate's circuitry. The substrate includes a first conductive layer with a plurality of conductors on which an electrical component may be positioned and electrically coupled. The pads are coupled to signal lines (e.g., using thru-holes) further within the substrate and these signal lines are further coupled to a second plurality of conductive pads located even further within the substrate. The signal lines are positioned so as to lie between the substrate's first conductive layer and a voltage plane within a third conductive layer below the second conductive layer including the signal lines. A second voltage plane may be used adjacent the first voltage plane of the third conductive layer. Thru-holes may also be used to couple the signal lines coupled to the first conductors to a second plurality of conductors which form part of the third conductive layer. A method of making the substrate, and an electrical assembly and information handling system (e.g., computer) utilizing the substrate are also disclosed.

10 Claims, 3 Drawing Sheets

CIRCUITIZED SUBSTRATE WITH IMPROVED IMPEDANCE CONTROL CIRCUITRY, METHOD OF MAKING SAME, ELECTRICAL ASSEMBLY AND INFORMATION HANDLING SYSTEM UTILIZING SAME

TECHNICAL FIELD

The invention relates to circuitized substrates such as printed circuit boards and those used in chip carriers. More particularly, the invention relates to such substrates which are designed for providing improved passage of electrical signals through designated signal lines which form part of the substrate's circuitry by controlling signal impedance levels.

BACKGROUND OF THE INVENTION

To keep with increasing demand for improvements in data processing capability, it is essential that today's semiconductor devices (chips) operate at higher and higher speeds. As a result, many circuit problems have arisen, including increased cross-talk noise between adjacent signal lines (traces), improper characteristic impedance matching, etc. Overcoming these problems is made all the more difficult by the accompanying demand for higher circuit densities within both the chip and the circuitized substrate (e.g., a printed circuit board or chip carrier substrate) having the chip mounted thereon and electrically coupled thereto. Adding still further to the difficulties of finding adequate solutions for such problems is the high demand for miniaturization in many of the end products (e.g., computers, servers, mainframes, etc.) which use such chips and accompanying substrates.

As defined herein, the present invention addresses the problem associated with impedance disruption when signals pass along highly dense signal lines in a compact, circuitized substrate electrically coupled to one or more semiconductor chips specifically designed for operating at higher speeds. Such disruption is deleterious to effective signal passage and, ultimately, effective operation of the end product. As further defined herein, the invention is able to do so while providing a highly dense plurality of conductive thru-holes within the substrate to further maximize the circuit design's operational characteristics. By the term "thru-hole" as used herein is meant to include what are also referred to in the art as "vias"; that is, conductive openings within the substrate body designed to interconnect designated conductive layers (especially signal planes) to pass signals there-between. A "via" may be in the form of an opening extending substantially from an outer surface of the substrate to a designated internal plane, in which case it is also referred to in the art as a "blind via". These are distinguishable over vias which are positioned entirely within the substrate and thus encapsulated by the substrate's dielectric material, which vias are also referred to as, simply, internal or buried "vias." It is also within the scope of the invention to utilize thru-holes which extend entirely through the substrate thickness, in which case these are referred to as plated through holes (or simply as PTHs). The term "thru-hole" as used herein is meant to include all three such openings.

Various substrates, primarily printed circuit boards (hereinafter also referred to as PCBs), have addressed impedance issues, including control.

In U.S. Pat. No. 6,775,122, issued Aug. 10, 2004, there is described a printed circuit board which includes two conductive planes. A "via" spans the planes, and an impedance "component" is placed in the via. The impedance component is coupled to both of the planes and allegedly provides an impedance level for the planes without the use of traces or hand soldering of components.

In U.S. Pat. No. 6,726,488, issued Apr. 27, 2004, there is described a high-frequency printed circuit board which allegedly enables matching of characteristic impedance at a connection of a line conductor and a through conductor and inhibition of unnecessary radiation of an electromagnetic wave from between the line conductor and a same plane ground conductor. This allegedly provides good high-frequency signal transmission characteristics, even in a high-frequency band such as a microwave band and a millimeter waveband.

In U.S. Pat. No. 6,707,685, issued Mar. 16, 2004, there is described a multi-layer printed circuit board which includes an insulating substrate having, on a central part of its top surface, a semiconductor device mounting portion and having, on its under surface, an external electrode. The insulating substrate includes multilayered wiring having a first group of parallel wiring lines, a second group of parallel wiring lines arranged orthogonal thereto, and a group of through conductors for providing electrical connection there-between. Power is supplied from the external electrode to the semiconductor device through built-in capacitors formed there-within. The built-in capacitors are connected in parallel that have different resonance frequencies within a range from an operating frequency band for the semiconductor device to a frequency band for a harmonic component. At an anti-resonance frequency occurring between the different resonance frequencies, a composite impedance is equal to or below a predetermined value.

In U.S. Pat. No. 6,677,831, issued Jan. 13, 2004, there is described a method to control differential signal trace impedance by allowing flexible use of different signal trace width and spacing while maintaining constant differential impedance within a printed circuit board. Differential impedance of a signal pair is determined by the geometry of individual traces and the spacing between traces. The value of the differential impedance is inversely proportional to signal trace width and directly proportional to signal trace spacing. By decreasing or increasing trace width and spacing simultaneously, a constant differential impedance is allegedly achieved.

In U.S. Pat. No. 6,405,431, issued Jun. 18, 2002, there is described a method for manufacturing a built-up multi-layer printed circuit board in which a YAG laser is used to form a "via hole" in the board. The method includes the steps of forming a first printed circuit pattern on a copper clad laminate by applying a general photo-etching process (the laminate having a copper foil on the one face thereof), stacking a resin-coated (on one face) copper foil on the laminate with the first printed circuit pattern formed thereon, and heating and pressing this structure. Next, a YAG laser is used to form a "via hole" at a predetermined position by removing the resin-coated copper foil, then carrying out an electro-less and electro copper plating on the board with the "via hole" formed therein to form a plated layer. A second printed circuit pattern is then formed on the plated layer to electrically connect the layers on which the first and second printed circuit patterns are formed.

In U.S. Pat. No. 6,119,335, issued Sep. 19, 2000, there is described a method for manufacturing a built-up multi-layer printed circuit board for use in computers, video tape recorders, and portable telephones in which a resin-clad copper foil is stacked on a copper-clad laminate after forming a printed circuit layer, following which this structure is heated and pressed. Then, beams of an Nd-YAG laser are irradiated to remove the copper-clad layer, following which beams of a CO-2 laser are irradiated to remove the residual resin insulator, thereby forming a "via hole". Circuit patterns are then formed on the board on which the "via hole" has been formed.

In U.S. Pat. No. 5,880,018, issued Mar. 9, 1999, there is described a method of making an interconnect structure having a dielectric layer with a low dielectric constant. In this method, portions of a silicon dioxide layer lying adjacent a conductive interconnect are removed to expose portions of a silicon nitride etch stop layer. A dielectric layer having a low dielectric constant is then formed overlying the conductive interconnect and the exposed portions of the silicon nitride etch stop layer. A portion of the dielectric layer is then removed to expose the top surface of the conductive interconnect to leave portions of the dielectric layer between adjacent conductive interconnects. The resulting interconnect structure allegedly has reduced cross-talk between conductive interconnects while avoiding disadvantages of reduced thermal dissipation and increased mechanical stress.

In U.S. Pat. No. 5,677,241, issued Oct. 14, 1997, there is described a method of forming integrated circuitry which includes providing a pair of spaced and adjacent electrically conductive elongated lines and providing electrically insulating material over the pair of spaced lines in a manner which leaves an elongated void between the lines, the elongated void being top sealed along its substantial elongated length. The electrically insulating material is provided by depositing electrically insulating material over the pair of lines in a manner which produces a retrograde cross-sectional profile of the insulating material relative to the respective line sidewalls and which leaves an elongated top sealed void within the insulating material between the lines, the elongated void being open at one end which is subsequently sealed. The formed circuitry includes a pair of spaced and adjacent electrically conductive elongated lines being encapsulated with an electrically insulating material. A top sealed elongated void is provided relative to the electrically insulating material between the lines, allegedly facilitating electrical isolation of the lines from one another.

It is thus seen from the above patents that various approaches have been attempted with respect to improving substrate construction and particularly with respect to enhanced signal passage. Some of these patents have also addressed impedance issues. The present invention provides another solution, this with respect to impedance control, and in an expeditious manner while not requiring significant cost increases or complex manufacturing processes. The solution provided herein results in a compact, miniaturized structure capable of meeting many of today's design and operational requirements. It is believed that such an invention would constitute a significant advancement in the art, as would various products (e.g., information handling systems) capable of using this new and unique substrate.

OBJECTS AND SUMMARY OF THE INVENTION

It is, therefore, a primary object of the present invention to enhance the art of circuitized substrates.

It is another object of the invention to provide a circuitized substrate capable of substantially eliminating impedance disruption therein during the passage of signals therethrough.

It is yet another object of the invention to provide a method of making such a substrate which can be performed using substantially conventional substrate (e.g., PCB) manufacturing processes and thus at relatively low cost.

It is still another object of the invention to provide an information handling system capable of utilizing the circuitized substrate taught herein and at least one accompanying electrical component as part thereof, such that the system will in turn take advantage of the several benefits of the new and unique substrate as taught herein.

According to one aspect of the invention, there is provided a circuitized substrate comprising a first conductive layer having a first plurality of conductive pads oriented in a pattern and adapted for being electrically coupled to a first electrical component, a second conductive layer including a plurality of signal lines, selected ones of these signal lines being electrically coupled to respective ones of the conductive pads of the first plurality of conductive pads, a first dielectric layer positioned substantially between the first and second conductive layers, a third conductive layer including a first voltage plane and a second plurality of conductive pads also oriented in a pattern, selected ones of the second plurality of conductive pads being electrically coupled to respective ones of the signal lines of the second conductive layer, and a second dielectric layer positioned substantially between the second and third conductive layers. The plurality of signal lines are positioned substantially between the first conductive layer and first voltage plane of the third conductive layer so as to substantially prevent impedance disruption during the transmission of signals through the signal lines.

According to another aspect of the invention, there is provided a method of making a circuitized substrate comprising the steps of providing a first conductive layer having a first plurality of conductive pads oriented in a pattern and adapted for being electrically coupled to a first electrical component, providing a second conductive layer including a plurality of signal lines, electrically coupling selected ones of the signal lines to respective ones of the conductive pads of the first plurality of conductive pads, providing a first dielectric layer positioned substantially between the first and second conductive layers, providing a third conductive layer including a first voltage plane and a second plurality of conductive pads also oriented in a pattern, electrically coupling selected ones of the second plurality of conductive pads to respective ones of the signal lines of the second conductive layer, and providing a second dielectric layer substantially between the second and third conductive layers such that the plurality of signal lines are positioned substantially between the first conductive layer and the first voltage plane of the third conductive layer so as to substantially prevent impedance disruption during the transmission of signals through the signal lines.

According to yet another aspect of the invention, there is provided an electrical assembly comprising a circuitized substrate including a first conductive layer having a first plurality of conductive pads oriented in a pattern, a second conductive layer including a plurality of signal lines, selected ones of the signal lines being electrically coupled to respective ones of the conductive pads of the first plurality of conductive pads, a first dielectric layer positioned substantially between the first and second conductive layers, a third conductive layer including a first voltage plane and a second plurality of conductive pads also oriented in a pattern, selected ones of the second plurality of conductive pads being electrically coupled to respective ones of the signal lines of the second conductive layer, and a second dielectric layer positioned substantially between the second and third conductive layers, the plurality of signal lines being positioned substantially between the first conductive layer and the first voltage plane of the third conductive layer so as to substantially prevent impedance disruption during the transmission of signals through the signal lines, and at least one electrical component positioned substantially on the circuitized substrate and electrically coupled to the first plurality of conductive pads.

According to still another aspect of the invention, there is provided an information handling system including a housing, a circuitized substrate including a first conductive layer having a first plurality of conductive pads oriented in a pattern, a second conductive layer including a plurality of signal lines, selected ones of the signal lines being electrically coupled to respective ones of the conductive pads of the first plurality of conductive pads, a first dielectric layer positioned substantially between the first and second conductive layers, a third conductive layer including a first voltage plane and a second plurality of conductive pads also oriented in a pattern, selected ones of the second plurality of conductive pads being electrically coupled to respective ones of the signal lines of the second conductive layer, and a second dielectric layer positioned substantially between the second and third conductive layers, the plurality of signal lines being positioned substantially between the first conductive layer and the first voltage plane of the third conductive layer so as to substantially prevent impedance disruption during the transmission of signals through the signal lines, and at least one electrical component positioned substantially on the circuitized substrate and electrically coupled to the first plurality of conductive pads.

BEST MODE FOR CARRYING OUT THE INVENTION

Figure 1:
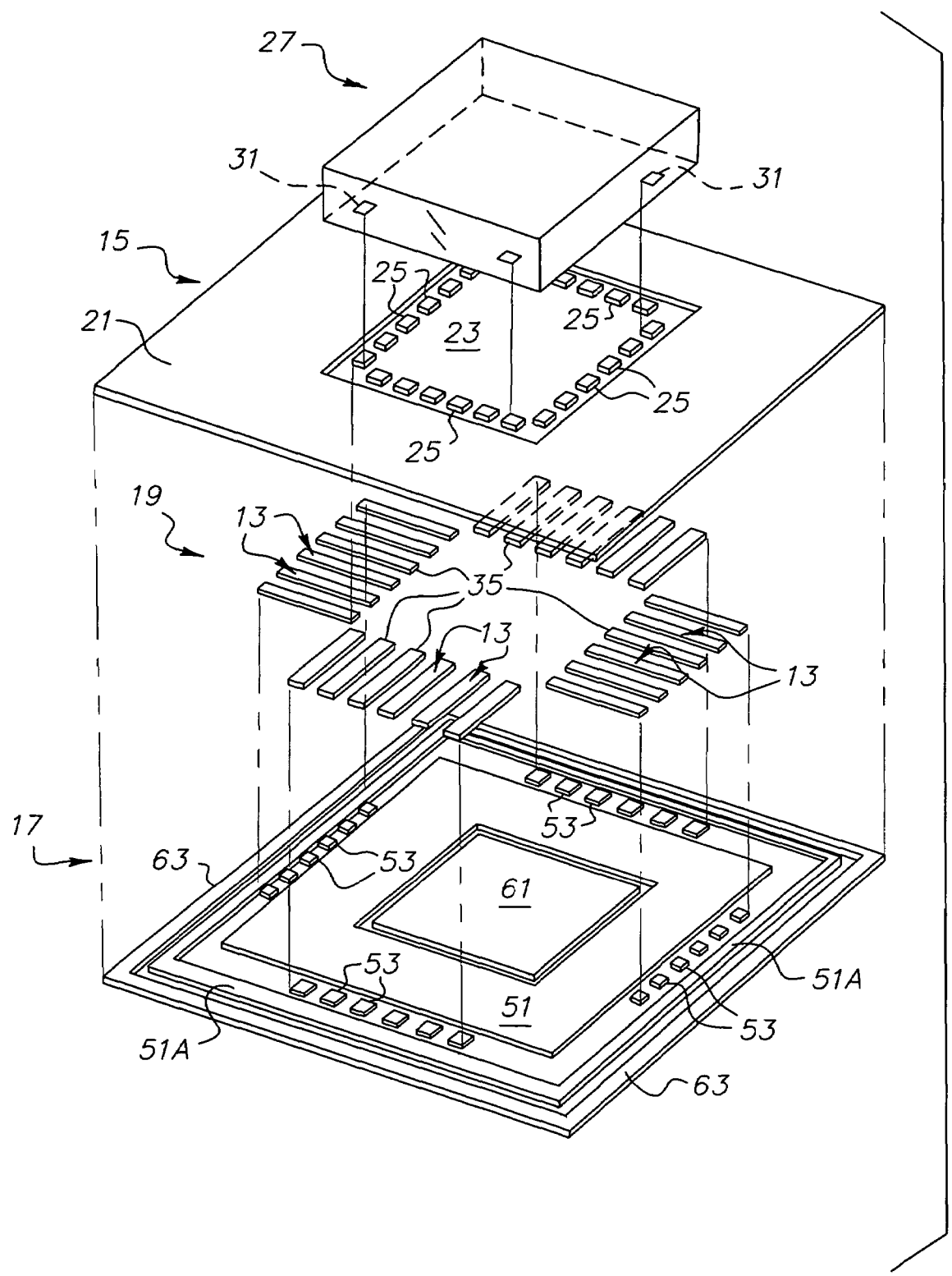
FIG. 1 is an exploded perspective view of respective conductive layers of a circuitized substrate in accordance with a preferred embodiment of the invention, including an electrical component shown in alignment with same.

For a better understanding of the present invention, together with other and further objects, advantages and capabilities thereof, reference is made to the following disclosure and appended claims in connection with the above-described drawings. Like figure numbers may be used from FIG. to FIG. to identify like elements in these drawings.

By the term "circuitized substrate" as used herein is meant to include substrates having at least two (and preferably more) dielectric layers and at least three (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen-applied, or it may be supplied as dry film. Final cure of the photo-imageable material provides a toughened base of dielectric on which the desired electrical circuitry is formed. An example of a specific photo-imageable dielectric composition includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photoinitiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 2 mils to about 4 mils thick, but also thicker or thinner if desired. Examples of circuitized substrates include printed circuit boards (or cards) and chip carriers when the afore-mentioned fiberglass-reinforced epoxy resins, polytetrafluoroethylene (Teflon), polyimides, polyamides, cyanate resins and photo-imageable materials are used as the dielectric material. It is believed that the teachings of the instant invention are also applicable to what are known as "flex" circuits (which use dielectric materials such as polyimide) and those which use ceramic or other non-polymer type dielectric layers, one example of the latter being what are referred to as multilayered ceramic (MLC) modules adapted for having one or more semiconductor chips mounted thereon.

By the term "electrical component" as used herein is meant components such as semiconductor chips and the like which are adapted for being positioned on the external conductive surfaces of such substrates and electrically coupled to the substrate for passing signals from the component into the substrate whereupon such signals may be passed on to other components, including those mounted also on the substrate, as well as other components such as those of a larger electrical system which the substrate forms part of.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional printed circuit board (PCB) typically having several external components such modules (including one or more chip carriers), semiconductor chips, etc. mounted thereon and coupled to the internal circuitry of the PCB.

Figure 2:
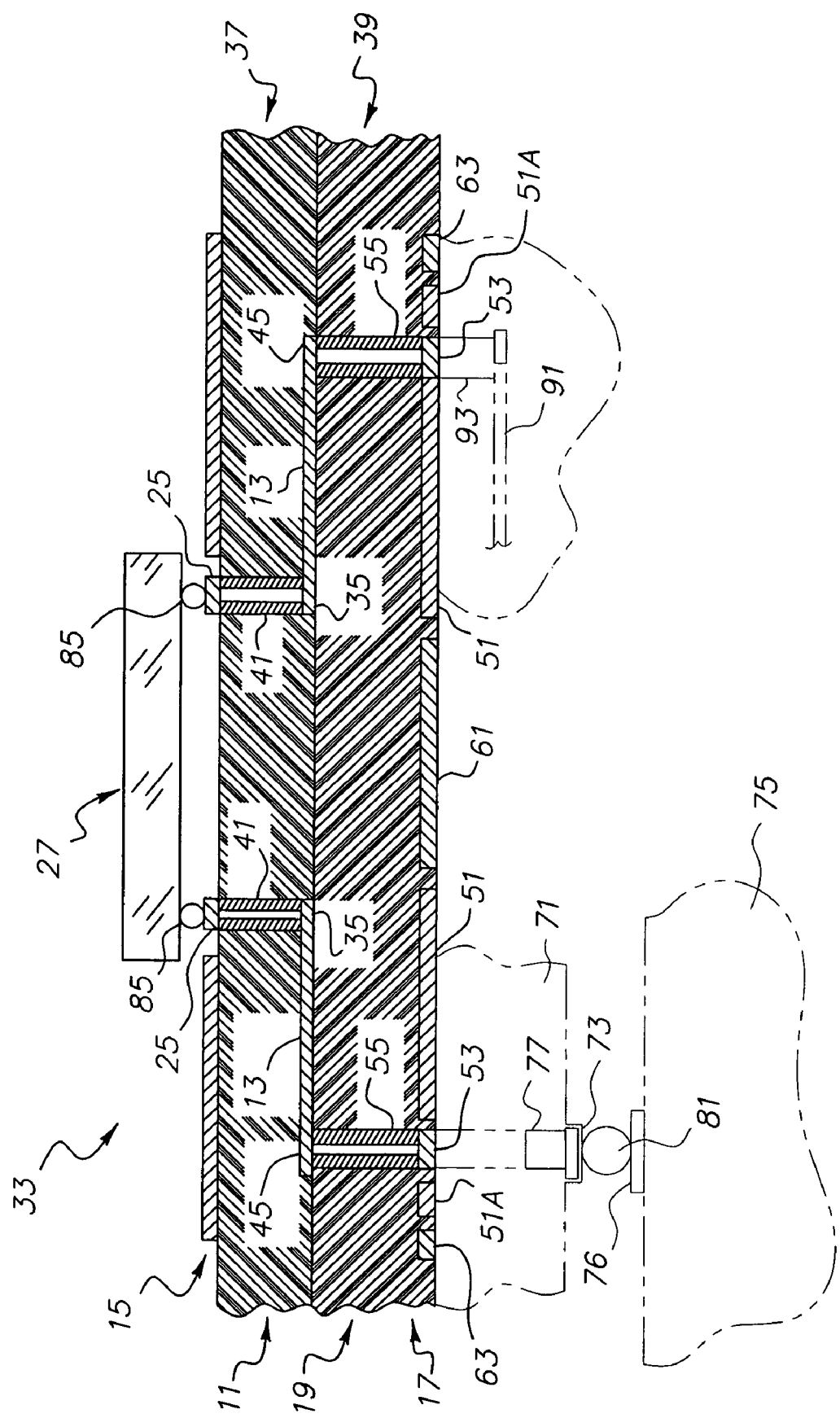
FIG. 2 is a partial elevational side view, in section and on a much enlarged scale over the view of FIG. 1, illustrating the circuitized substrate as shown partly in FIG. 1 and including additional necessary elements such as the invention's first and second dielectric layers. Optional additional layers and other structure are also shown (in phantom), as is one example of an electrical component for being positioned on the substrate.

FIG. 1 is an exploded perspective view depicting three conductive layers used in a circuitized substrate 11 (see FIG. 2) according to one embodiment of the invention. Reference is also made to FIG. 2 with respect to the description of FIG. 1 for comparison purposes. FIG. 1 does not include the invention's dielectric layers, nor does it illustrate possible additional elements. These are shown in phantom in FIG. 2.

A significant feature of the present invention is the alignment of the signal lines 13 between the first and third conductive layers 15 and 17 in such a manner so as to substantially eliminate impedance disruption during passage of signals (including high speed signals) through the substrate and particularly along the plane of the second conductive plane (19) in which these individual lines 13 are oriented. (Although the signal lines are shown as being linear, it is understood that such lines are typically nonlinear and in a pattern designed to minimize the lengths thereof while achieving the connections needed in the most expeditious manner on the surface on which such lines reside. The linear forms are shown for ease of illustration.) Such impedance disruption has been found to occur as the signals pass along lines which are aligned adjacent a conductive plane having two different voltage levels, as the signals "cross over" the borders of the two or more parts of the adjacent conductive plane containing these different voltage levels. By adjacent as used in this manner is meant where the signal lines are spaced from the adjacent conductive plane with its different voltage levels in such close proximity that this disruption in impedance will occur. Such closeness of spacing is considered essential to meet today's strict design rules, particularly with respect to high density circuit patterns and miniaturization. The present invention eliminates impedance disruption by strategically aligning the planar signal lines adjacent only one voltage plane of a larger conductive plane, such that there is no "cross over" during signal passage through the lines in the plane. That is, the signal lines do not extend between two contiguous voltage planes having different voltages. On the opposite conductive plane (the first, 15, in this particular example), there is a substantially solid plane which is preferably a ground plane for the final electrical assembly using the substrate. As further defined herein, the third conductive plane also includes a ground portion as part thereof, this ground substantially surrounding the voltage plane to which the signal lines are aligned.

Comparing FIGS. 1 and 2, the first conductive plane (or layer, a term usable for planes 17 and 19 as well) 15 includes the defined, substantially solid ground plane 21 which in turn includes an opening 23 therein. The term "plane" is used herein on occasion to reference a part of an overall larger planar conductive layer, ground plane 21 understandably being part of the overall conductive layer which also includes the pads 25 (below) as well as possibly other conductive structure such as other signal lines, voltage "planes" (or portions), ground "planes", etc. Located within opening 23 is a first plurality of conductive pads 25, which as shown particularly in FIG. 2, are adapted for having a first electrical component 27 (i.e., a semiconductor chip, as shown, having a plurality of contact sites 31 (not shown in FIG. 2 but shown hidden in FIG. 1) on an undersurface thereof, as is known in the art) electrically coupled thereto when the component is positioned on the substrate 11. As defined herein, the combination of the circuitized substrate 11 and the component 27 form what is referred to as an electrical assembly 33. With respect to same, it is well within the scope of the invention to provide more than one such electrical component 27 as part thereof, many such assemblies often including several chips, modules, and the like on an upper surface thereof. The latter is especially true with respect to PCBs compared to chip carriers, chip carriers often having only one chip as an element thereof. The term circuitized substrate as used herein is thus meant to also include a printed circuit board (PCB).

In a preferred embodiment, plane 21 and pads 25 are each of copper or copper alloy, known materials in the art. The preferred number of pads 25 matches the corresponding number of contact sites 31 on chip 27. Pads 25 and plane 21 are each preferably about one mil in thickness. Similarly, the corresponding number of signal lines 13 matches the number of pads, as these lines are electrically coupled at one end 35 to respective ones of the pads 25. This is not meant to limit the invention, however, because it is understood that there may be several additional signal lines and/or other conductor in the same region occupied by lines 13. Signal lines 13 are each also preferably of known copper or copper alloy. In one embodiment, these lines each have a thickness of about one mil (thousandths of an inch) and a width of about one mil. Further, these lines are spaced apart by a little as about one mil spacing between the lines. This represents a significant aspect of the invention because it shows the relatively high density patterns of signal lines attainable using the teachings of the invention while also assuring the desired feature of impedance disruption avoidance.

Substrate 11 further includes a first dielectric layer 37 (FIG. 2), preferably of one of the dielectric materials listed above. This layer, in one embodiment, is only about two mils thick and serves as the host layer for the elements of the first conductive plane 15. Formation of these elements is preferably accomplished using conventional photolithographic processes known in the PCB art. Further description is not believed needed. Substrate 11 further includes a second dielectric layer 39 (FIG. 2), also preferably of one of the above materials and even more preferably of the same material and thickness as layer 37. Layer 39 serves as the host layer for signal lines 13 and any other conductive elements which might be added as part thereof, and is also preferably formed using conventional photolithographic processes.

Connection between the ends 35 of lines 13 and pads 25 is preferably achieved using a plurality of conductive thru-holes (in this case, blind "vias") 41. Typically, these holes 41 are formed within the dielectric using conventional mechanical means (drills) or lasers and then plated with a suitable conductive metal such as copper. In the present invention, the holes each include a diameter of only about two mils, with the corresponding copper plating only about one-half mil on the internal walls thereof. As further evidence of the highly dense thru-hole patterns available using the teachings of this invention, such thru-holes may be spaced apart as little as eight mils on a center-to-center spacing. It is also within the scope of this invention to add conductive paste (not shown) or the like within the holes as an enhanced conductive medium. Such pastes are known and further description not considered necessary. With the connections shown as being directly beneath the component's peripheral portion (location of the contact sites 31), the signal lines 13 are then designed to "fan out" from the corresponding central portion of the second conductive plane shown below the body of the component (and opening 23 in plane 15) to a wider pattern such that subsequent ends 45 lie well outside the region under component 27. Notably, these ends terminate at a location before the periphery of the upper solid ground plane 21.

The third conductive plane (layer) 17 is preferably comprised of at least three different conductive parts. One of these is the mentioned voltage plane, represented by the numeral 51, over which are positioned the signal lines 13 of the plane/layer having these in. As mentioned, the signal lines remain within the "confines" of this one voltage plane pattern as projected upwardly to layer 19 to assure the mentioned characteristic of not disrupting signal line impedance. Plane 51 is shown as being substantially solid for illustration purposes but may assume another configuration (than the rectangular one depicted), depending on the design requirements for substrate 11. Of significance, voltage plane 51 further includes a second portion 51A which is located substantially around the main portion shown by the numeral 51, but in fact is also electrically coupled thereto (such coupling not shown for ease of illustration). Substantially between the two portions 51 and 51A is located a plurality of second conductive pads 53, designed for being electrically coupled to the opposing (to ends 35) ends 45 of signal lines 13. Such connections are preferably accomplished using a plurality of conductive thru-holes 55 (FIG. 2) of the same materials and dimensions as holes 41. These holes 55 are also formed with the second dielectric layer 39 using the same procedures as used for holes 41. The preferred number of pads 53 is obviously the same as the number of terminating ends 45 of the signal lines 13.

Third plane 17 may also include a second voltage portion (plane) 61 located below component 27 but not aligned beneath any of the signal lines 13, That is, the signal lines do not "extend" inwardly enough to be aligned "over" this second voltage portion 61. The voltage planar portion 61 (also referable to as a voltage plane) is provided in this position and includes a different voltage than that of plane 51 to add greater operational capabilities for the invention. Although shown as being substantially solid, this configuration is not essential and the plane may assume several other configurations. In one example of the invention, the voltage for plane 51 was about two and one-half volts and that of plane 61 about one and one-half volts. Finally, the third plane 17 also includes a ground portion 63 which is located substantially around voltage portion 51A (and thus the interior voltage portion 51 and the conductive pads 53). Ground portion 63 provides electrical grounding for this portion of the substrate, as does the ground plane 21 located on layer 37. As shown in both FIG. 1 and FIG. 2, the outer periphery of ground portion 63 aligns substantially with the outer periphery of the upper ground plane 21. Each of the conductive parts of conductive plane 17 are preferably also comprised of the same copper or copper alloy material as the earlier, above two layers. Preferably, each is about one mil thick as well.

FIG. 2 also represents various additional structure which can be used with and thus form part of the circuitized substrate of this invention, again depending on design requirements for the final product. In almost all examples, it is preferable for substrate 11 to include more than the number of conductive and dielectric layers shown. If substrate 11 is a PCB, it may include more than a total of thirty conductive and interim dielectric layers. If a chip carrier, generally this number will be less. In one example, substrate 11 may include a dielectric layer 71 (phantom) which may in turn be of the same materials and thicknesses as layers 37 and 39. If layer 71 is an outer layer, as shown, it may include an external conductive pad 73 (phantom, only one shown) such that the substrate can be electrically coupled to an underlying substrate 75 such as a PCB. This underlying substrate may in turn include its own external pads 76 (phantom, only one shown) to which the corresponding pads 73 are coupled, preferably using a plurality of known solder ball connections 81 (in phantom, only one being shown). In reality, there are preferably several external pads 73 and various means to couple these to the internal circuitry of substrate 11, one of these being a conductive thru-hole 77 similar to holes 41 and 55. As indicated in FIG. 2, such solder ball connections 85 are also the preferred means of coupling component 27 to pads 25. Still further, it is within the scope of the invention to provide connections between the signal conductive pads 53 and other internal conductive layers 91 (shown in phantom to the lower right in FIG. 2), including utilizing conductive thru-holes 93 similar to holes 41 and 55 (and 77, as used to couple pads 53 to the outer pads 73 to the lower right of the substrate shown in solid in FIG. 2).

Figure 3:
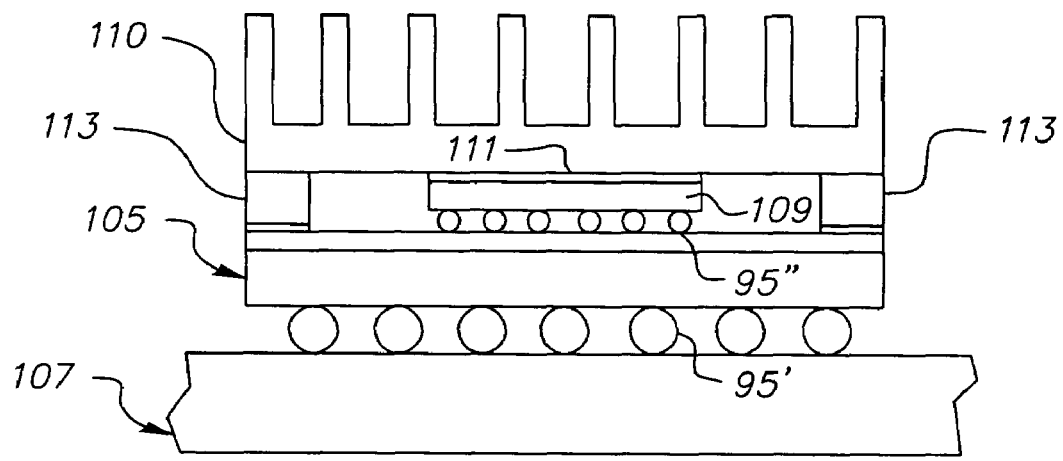
FIG. 3 is a side elevational view illustrating one example of a circuitized substrate (a PCB) of the invention and an example of an electrical assembly (a chip carrier) adapted for being positioned on and electrically connected to the substrate.

FIG. 3 represents examples of the structures defined herein-above, the structure referenced by the numeral 105 being a chip carrier similar to the carrier 33 in FIG. 2, while the structure represented by the numeral 107 is a PCB. Both such PCB and chip carrier assemblies are produced and sold by the assignee of the invention. In the embodiment (assembly) of FIG. 3, the chip carrier 105 is mounted on and electrically coupled to PCB 107 using a plurality of solder balls 95' (preferably of conventional tin-lead composition as are solder ball connections 81 and 85), the chip carrier 105 in turn having a semiconductor chip 109 positioned thereon and electrically coupled to the carrier using the second plurality of solder balls 95" (also preferably of conventional tin-lead composition). The assembly in FIG. 3 may also include a heat sink 110 thermally coupled to the chip 109, e.g., using a conductive paste 111, and positioned on the upper surface of carrier 105 by appropriate standoffs 113, as is known in the art. It is also within the scope of those skilled in the art to utilize an encapsulant material (not shown) to substantially encase the chip and also to possibly eliminate the need for the heat sink if such an encapsulant material is used. Encapsulant material is also possible about the lower pluralities of solder balls 95'. It is even further within the scope of the invention to couple chip 109 using conventional wire-bonding in which a plurality of fine wires (not shown) are bonded between chip conductor sites and corresponding conductor pads on the underlying substrate.

Figure 4:
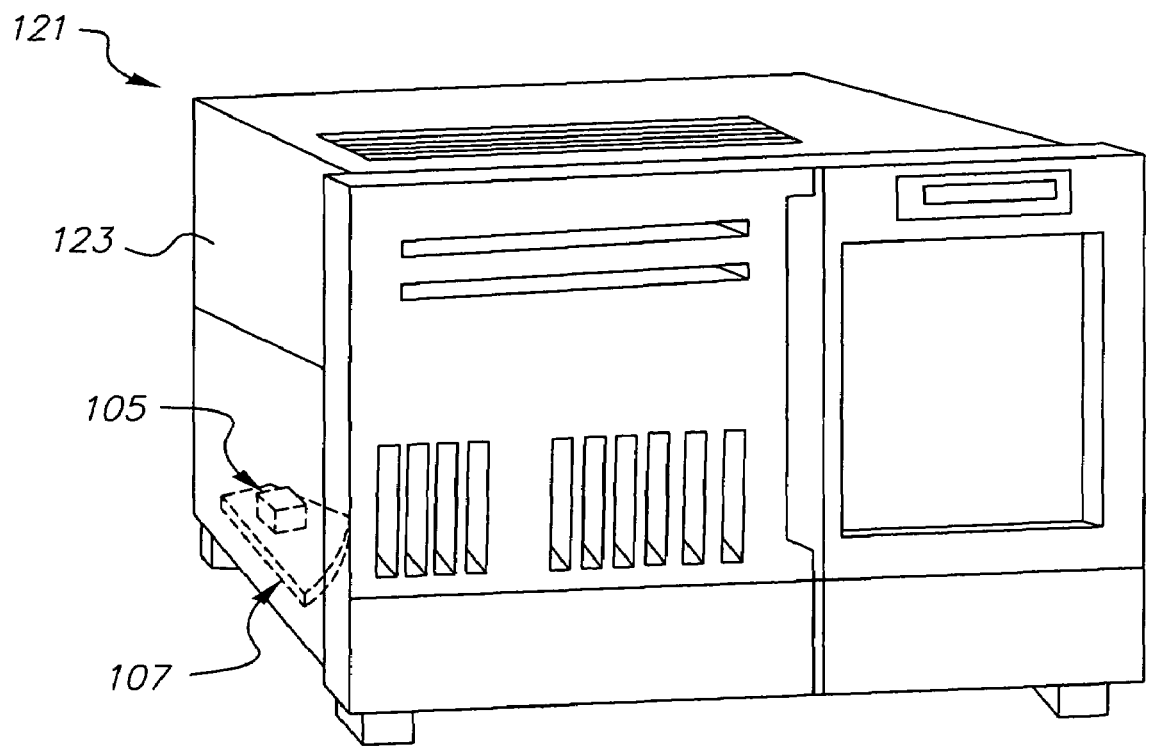
FIG. 4 is a perspective view of an information handling system adapted for using one or more of the circuitized substrates of the instant invention.

In FIG. 4, there is shown an information handling system 121 which is preferably a personal computer, a mainframe computer or a computer server. Other types of information handling systems known in the art of this type may also utilize the teachings of this invention. The circuitized substrate or substrates as formed in accordance with the teachings herein may be utilized in the system 121 as a PCB 107 (shown hidden) and/or a chip carrier 105 (also shown hidden). The circuitized substrates may be utilized as a mother board in system 121 or as one or more individual PCBs typically utilized in such systems. As is known, systems 121 are usually contained within a suitable metal or insulative housing such as shown by the numeral 123, with appropriate venting (if desired) therein, as well as instrumentation externally accessible for system operation by the system's designated operator. The remaining elements of information handling systems of these types are known in the art and further description is not believed necessary.

While there have been shown and described what at present considered the preferred embodiments of the invention, it will be obvious to those skilled in the art that various changes and modifications may be made therein without departing from the scope of the invention as defined by the appended claims. The invention as defined herein is capable of transmitting high speed (frequency) signals at a rate of from about one Gigabits/sec to about ten Gigabits/second, while substantially preventing impedance disruption. It is also capable of being produced using conventional PCB processing so as to assure reduced cost and facilitate ease of manufacture. That is, the preferred method for assembling substrate 11 in FIG. 2 is to use conventional lamination processes in which the dielectric layers, having the designated circuitry and/or conductive elements (planes) thereon are "stacked up" in aligned manner with one another and subjected to relatively high pressures and temperatures associated with conventional lamination.

What is claimed is:

1. A circuitized substrate comprising:
a first conductive layer having a first plurality of conductive pads oriented in a pattern and adapted for being electrically coupled to a first electrical component;
a second conductive layer including a plurality of signal lines, selected ones of said signal lines being electrically coupled to respective ones of said conductive pads of said first plurality of conductive pads;
a first dielectric layer positioned substantially between said first and second conductive layers,
a third conductive layer including first and second voltage planes oriented adjacent one another and a second plurality of conductive pads also oriented in a pattern, selected ones of said second plurality of conductive pads being electrically coupled to respective ones of said signal lines of said second conductive layer, said second voltage plane having a different voltage than said first voltage plane; and
a second dielectric layer positioned substantially between said plurality of signal lines of said second conductive layer and said third conductive layer, said plurality of signal lines of said second conductive layer being positioned substantially between said first conductive layer and said first voltage plane of said third conductive layer but not being positioned between said first conductive layer and said second voltage plane oriented adjacent said first voltage plane so as to extend between said first and second voltage planes, thereby substantially preventing impedance disruption during the transmission of signals through said signal lines.

2. The circuitized substrate of claim 1 wherein said first conductive layer further includes a first ground plane adjacent said first plurality of conductive pads, said signal lines of said second conductive layer also positioned substantially between said first ground plane and said first voltage plane within said third conductive layer but not between said first ground plane and said second voltage plane oriented adjacent said first voltage plane.

3. The circuitized substrate of claim 1 wherein said third conductive layer further includes a second ground plane substantially surrounding said first and second voltage planes oriented adjacent one another.

4. The circuitized substrate of claim 1 wherein said first voltage plane substantially surrounds said second voltage plane.

5. The circuitized substrate of claim 1 wherein said first dielectric layer includes a plurality of thru-holes therein, selected ones of said thru-holes electrically interconnecting selected ones of said first plurality of conductive pads with respective ones of said plurality of signal lines.

6. The circuitized substrate of claim 5 wherein said second dielectric layer includes a plurality of thru-holes therein, selected ones of said thru-holes electrically interconnecting selected ones of said signal lines with respective ones of said second plurality of conductive pads.

7. The circuitized substrate of claim 6 further including at least one third conductive pad for being electrically coupled to a second electrical component or a second circuitized substrate, and a third dielectric layer, said at least one third conductive pad being located on said third dielectric layer.

8. The circuitized substrate of claim 7 wherein said third dielectric layer includes at least one thru-hole therein, said at least one thru-hole electrically interconnecting one of said conductive pads of said second plurality of conductive pads and said at least one third conductive pad.

9. The invention of claim 1 wherein said circuitized substrate is a printed circuit board.

10. The invention of claim 1 wherein said circuitized substrate is a chip carrier.

* * * * *